United States Patent [19]

Berg

[11] 4,447,842
[45] May 8, 1984

[54] FINNED HEAT EXCHANGERS FOR ELECTRONIC CHIPS AND COOLING ASSEMBLY

[75] Inventor: William C. Berg, Stillwater, Minn.

[73] Assignee: Control Data Corporation, Minneapolis, Minn.

[21] Appl. No.: 383,887

[22] Filed: Jun. 1, 1982

[51] Int. Cl.³ .............................................. H05K 7/20
[52] U.S. Cl. .................................. 361/386; 361/385; 165/185; 357/82
[58] Field of Search ............... 361/381, 382, 383, 384, 361/385, 386, 387, 388, 389; 165/76, 185, 80; 357/82, 81; 174/16 HS

[56] References Cited

U.S. PATENT DOCUMENTS

| | | | |
|---|---|---|---|
| 3,064,505 | 11/1962 | Pierce | 77/63 |
| 3,589,704 | 6/1971 | Kurtz | 269/7 |
| 3,596,228 | 7/1971 | Reed et al. | 339/59 |
| 3,893,162 | 7/1975 | Weidemann | 357/82 |
| 3,911,327 | 10/1975 | Murari et al. | 317/100 |
| 3,924,843 | 12/1975 | Hirmann | 269/20 |
| 3,938,797 | 2/1976 | Frederick | 269/20 |
| 3,993,123 | 11/1976 | Chu et al. | 165/80 |
| 4,298,904 | 11/1981 | Koenig | 361/386 |
| 4,381,032 | 4/1983 | Cutchaw | 361/385 |

Primary Examiner—G. P. Tolin
Attorney, Agent, or Firm—J. A. Genovese; Edmund Wasp

[57] ABSTRACT

A PC board supported by a frame has an electronic chip secured thereto. The chip has a pair of heat exchange fins. Each fin projects through a groove and into a channel of a cooling module intermediate a cooling surface of the cooling module and an expansible conduit. Each expansible conduit is totally contained within one of the channels of the cooling module and has an expanded condition and a collapsed condition. When the conduits are in their collapsed condition, the fins can be inserted through the grooves and moved along the channels of the cooling module. When the conduits are in their expanded condition, they press against the fins to force the fins against the cooling surfaces of the cooling module to cool the chip. When the expansible conduits are collapsed, the fins can be withdrawn from the cooling module channels as the PC board is withdrawn from the frame.

9 Claims, 3 Drawing Figures

FINNED HEAT EXCHANGERS FOR ELECTRONIC CHIPS AND COOLING ASSEMBLY

BACKGROUND OF THE INVENTION

The present invention relates to cooling technology for electronic chips, and more specifically, to the cooling of chips having cooling fins.

Various types of heat exchange fins have been operably connected to electronic chips to cool the chip circuitry. Typically, the fins cooled by a forced air flow. The present invention applies to a cooling fin which is conduction cooled by direct contact with a cooling block.

SUMMARY OF THE INVENTION

The present invention comprises a chip cooling assembly wherein the chip cooling fins are slideably insertable into channels lying adjacent the cooling surfaces of cooling blocks. Each fin of the dual cooling fin design of each chip is inserted into a channel intermediate an expansible conduit and a cooling surface. The expansible conduits are totally contained within the channels of the cooling module. When the expansible conduits are in their collapsed condition, the fins can be moved freely along the channels or even withdrawn from the channels. When the expansible conduits are filled with pressurized air, they assume their expanded condition and force the fins against the cooling surfaces to effectively cool the chip circuitry.

It is, therefore, an object of the present invention to provide an improved cooling structure for an electronic chip.

It is a further object to present an expansible conduit concept employed to selectively force the heat exchange fin, or fins, of a chip against the cooling surface of a cooling element.

It is a further object to present an expansible device for forcing cooling fins of a chip against the cooling surfaces of a cooling module which is selectively collapsible to permit withdrawal of the fins from the module.

It is yet another object to present a dual fin heat exchange element for a chip which can be employed with the teachings of the present invention.

Still another object is to present a dual fin design which allows for equal and opposite actuating forces to be applied to the fins so that all stresses on the pins of the chip generated by the actuating forces are balanced.

These and other objects, advantages, and novel features of the invention will become apparent from the following detailed description of the invention taken in conjunction with the acompanying figures.

DESCRIPTION OF THE PREFERRED EMBODIMENT

Figure 1:
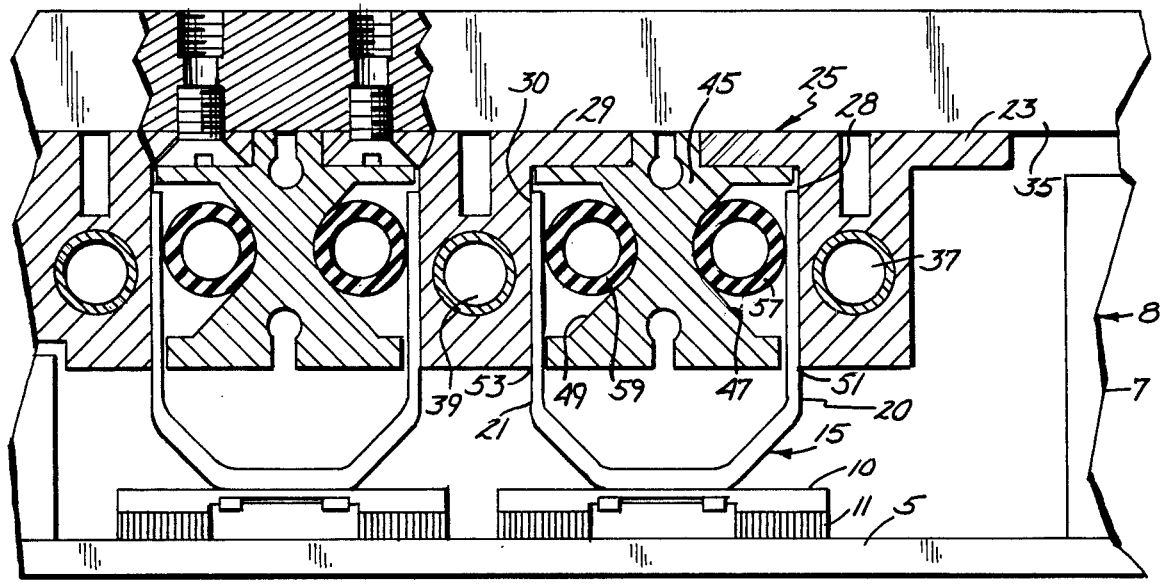
FIG. 1 shows an elevational view of the present invention with the conduits in their collapsed condition.

With reference to FIG. 1, a PC board 5 is secured to the backing 7 of a frame 8. The board 5 is slideably mounted in frame 8 so that it can be detached and withdrawn from frame 8. To detach the PC board 5 it would be withdrawn "out of the paper" towards the reader.

Figure 3:
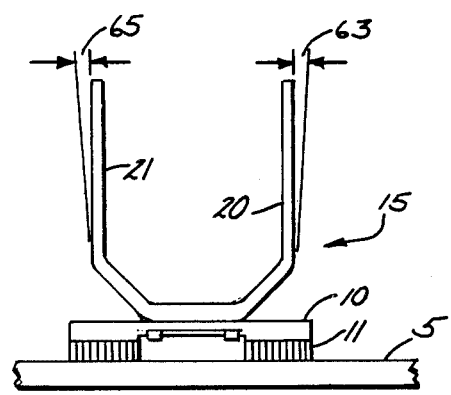
FIG. 3 shows the dual cooling fin design of the present invention with the fins shown in their normal position.

A plurality of chips 10 are mounted on the board 5 by pins 11. Each chip 10 has a dual fin heat exchange element 15. The element 15 has a first cooling fin 20 and a second cooling fin 21. FIG. 3 shows a chip 10 with the fins 20 and 21 in their normal position. Note that each fin 20 and 21 is substantially vertical in its normal position.

Figure 2:
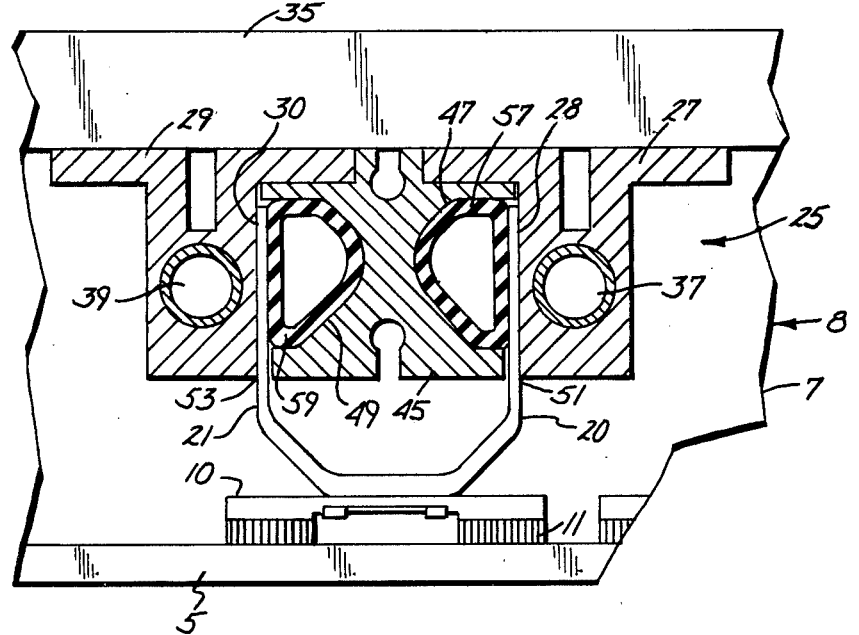
FIG. 2 shows an elevational view of the present invention with the conduits in their expanded condition.

As shown in FIGS. 1 and 2, the fins 20 and 21 extend upwardly into a cooling module 25. Cooling module 25 includes a first cooling block 27 and a second cooling block 29. Each of the blocks 27, 29 is secured to an overlying frame member 35. The blocks 27, 29 carry respective chilled water, or freon, conduits 37, 39 as shown. These conduits 37, 39 cool the blocks 27, 29. Cooling block 27 has a first cooling surface 28 and cooling block 29 has a second cooling surface 30.

A conduit carrying member 45 is secured to frame member 35 between first cooling block 27 and second cooling block 29. Conduit carrying member 45 has a first channel 47 disposed adjacent to and along first cooling surface 28, and a second channel 49 disposed adjacent to and along second cooling surface 30. A first groove 51 is provided between member 45 and first cooling block 27, and a second groove 53 is provided between member 45 and a second cooling block 29. A first length of expansible conduit 57 is disposed in channel 47 and a second length of expansible conduit 59 is disposed in channel 49. Conduits 57 and 59 may be part of a single continuous flexible conduit and both conduits 57 and 59 are connected to a source of pressurized air such as a pump (not shown). In the preferred embodiment conduits 57 and 59 are sections of a continuous rubber air hose. The conduits 57, 59 are totally enclosed within the cooling module channels as shown. The conduits 57, 59 are totally contained along the length of channels 47, 49 as well as at the ends of the channels (not shown). Conduits 57 and 59 are shown in their collapsed condition in FIG. 1. When the conduits 57, 59 are filled with pressurized air (or some other fluid) they assume the expanded condition shown in FIG. 2.

When the conduits 57 and 59 are in their collapsed condition, the fins 20 and 21 of the chips 10 can be inserted into the cooling module 25 with the fins 20, 21 sliding along the grooves 51, 53 and channels 47, 49 as the PC board 5 is inserted into the frame 8 and secured to backing 7. Once the board 5 has been plugged into the backing 7 of frame 8, the expansible conduits 57 and 59 can be filled with air under pressure to assume their expanded condition shown in FIG. 2. In this expanded condition, first conduit 57 forces first fin 20 against first cooling surface 28, while second conduit 59 forces second fin 21 against second cooling surface 30. The conduits 57, 59 thus force the fins 20, 21 to pass through an outward deflection through respective angles 63, 65 against the inherent spring forces of fins 20, 21. See FIG. 3. By clamping fins 20, 21 directly against the cooling surfaces 28, 30, by means of conduits 57, 59, the chips are effectively cooled. It is essential to proper cooling that the fins 20, 21 make good direct surface contact with the cooling surfaces 28, 30, and the present invention readily achieves this object. Note that the conduits 57 and 59 simultaneously apply equal and opposite forces on fins 20 and 21 so that the forces on the pins 11 of each chip 10 are balanced.

To extract the board 5 from frame 8, the conduits 57 and 59 are collapsed so that the fins 20, 21 can be slideably withdrawn along the respective grooves 51, 53 and channels 47, 49 of cooling module 25.

Note that the foregoing has described the preferred embodiment of the present invention only and that other variations are within the teachings of the invention. For example, the invention is applicable to a chip having one fin or more than two fins as well so long as an expansible member is used to force the fin, or fins, against a cooling surface(s). Moreover, it is envisioned that rows of chips having the dual fin, or other fin, design would be mounted on the same board (possibly on both sides) and that suitable expansible conduits would simultaneously force all of the fins into effective cooling contact with associated cooling surfaces. Likewise, in such an embodiment, the conduits would be simultaneously collapsible to simultaneous release the clamping force of the conduits from the fins to permit unobstructed withdrawal of the board from the module.

Having, therefore, disclosed the preferred embodiment of the invention, it is intended to be understood that various modifications and variations would be obvious to one skilled in the art, and that the invention is accordingly intended to be limited only by the scope of the appended claim.

I claim:

1. A cooling assembly including an electronic chip, comprising:
    a frame;
    a means supporting said chip, said chip supporting means being supported by said frame;
    a cooling member supported by said frame;
    a heat exchange member operably secured to said chip;
    an expansible conduit, and
    a means supporting said expansible conduit, said expansible conduit supporting means being supported by said frame, said expansible conduit having an expanded condition and a collapsed condition, and a means selectively converting said expansible conduit between said expanded and said collapsed conditions, said heat exchange member being positioned between said expansible conduit and said cooling member, said expansible conduit contacting said heat exchange member in said expanded condition and forcing said heat exchange member into contact with said cooling member so that said chip is cooled by said cooling member.

2. The cooling assembly of claim 1 wherein said expansible conduit supporting means comprises an expansible conduit carrying member secured to said frame, said expansible conduit carrying member supporting said expansible conduit.

3. The cooling assembly of claim 1 wherein said expansible conduit supporting means comprises a channel formed in said cooling member, said expansible conduit being supported in said channel.

4. The cooling assembly of claim 1 wherein said cooling member has a cooling surface and wherein a channel is provided adjacent said cooling surface, said expansible conduit being enclosed by said channel, said channel including a groove, said heat exchange member being received within said groove, and slideably moveable along said channel intermediate said cooling surface and said expansible conduit when said expansible conduit is in said collapsed condition, said expansible conduit forcing said heat exchange member against said cooling surface when said expansible conduit is in said expanded condition.

5. The cooling assembly of claim 1 wherein said heat exchange member is a fin, said fin providing a heat sink for said chip.

6. The cooling assembly of claim 5 wherein said expansible conduit overcomes a spring force in said fin to force said fin against said cooling member when said expansible conduit is in said expanded condition.

7. A cooling assembly including an electronic chip, comprising:
    a frame;
    a means supporting said chip supported by said frame;
    a cooling means supported by said frame, said cooling means having a first cooling surface and a second cooling surface;
    a heat exchange member operably secured to said chip and having a first fin and a second fin;
    a first length of expansible conduit and a second length of expansible conduit, said first and second lengths of expansible conduit having collapsed and expanded conditions, and a means operably associated therewith selectively converting said first and second expansible conduits between said collapsed and expanded conditions;
    a means supporting said first and second expansible conduits proximate to said first and second fins, respectively, said conduit supporting means being supported by said frame; said first fin being positioned intermediate said first cooling surface and said first expansible conduit, said second fin being positioned intermediate said second cooling surface and said second expansible conduit; said first expansible conduit forcing said first fin against said first cooling surface in said expanded condition; said second expansible conduit forcing said second fin against said second cooling surface in said expanded condition.

8. The cooling assembly of claim 7 wherein said cooling means comprises a first cooling block and a second cooling block, said first cooling block including said first cooling surface, said second cooling block including said second cooling surface, said conduit supporting means being positioned between said first cooling surface and said second cooling surface, said conduit supporting means having a first channel disposed adjacent said first cooling surface and a second channel disposed adjacent said second cooling surface, said first length of expansible conduit being disposed in said first channel, said second length of exansible conduit being disposed in said second channel, said first fin being moveable along said first channel adjacent said first cooling surface when said first expansible conduit is in said collapsed condition, said second fin being moveable along said second channel adjacent said second cooling surface when said second expansible conduit is in said collapsed condition.

9. The cooling assembly of claim 7 wherein said first expansible conduit overcomes an internal spring force of said first fin to force said first fin against said first cooling surface in said expanded condition, and said second expansible conduit overcomes an internal spring force of said second fin to force said second fin against said second cooling surface in said expanded condition, said first and second expansible conduits simultaneously applying opposite outward forces on said first and second fins in said expanded condition to force said first and second fins against said first and second cooling surfaces.

* * * * *